(12) United States Patent
Park

(10) Patent No.: US 6,240,025 B1
(45) Date of Patent: May 29, 2001

(54) VOLTAGE GENERATOR

(75) Inventor: Kee Teok Park, Ichon-shi (KR)

(73) Assignee: Hyundai Electronics Co., Ltd., Kyoungki-do (KR)

(*) Notice: Subject to any disclaimer, the term of this patent is extended or adjusted under 35 U.S.C. 154(b) by 0 days.

(21) Appl. No.: 09/604,296

(22) Filed: Jun. 26, 2000

(30) Foreign Application Priority Data

Jun. 30, 1999 (KR) .................................................. 99-26072

(51) Int. Cl.[7] ........................................................ G11C 7/00

(52) U.S. Cl. ............................... 365/189.09; 365/189.11; 365/226; 327/536; 327/566; 323/315

(58) Field of Search ..................................... 327/536, 537, 327/540, 566; 365/189.09, 189.11, 226; 323/315

(56) References Cited

U.S. PATENT DOCUMENTS 5,003,197 * 3/1991 Nojima et al. ........................ 327/536
6,038,178 * 3/2000 Oh ........................................ 327/537

* cited by examiner

*Primary Examiner*—Shawn Riley
(74) *Attorney, Agent, or Firm*—Nath & Associates PLLC; Gary M. Nath; Marvin C. Berkowitz

(57) ABSTRACT

A voltage generator is disclosed which has a charge pump unit including a pump transistor for performing a charge pumping operation by a pump control signal from a ring oscillator and a precharge transistor for performing a charge precharge operation by a precharge control signal from the ring oscillator. The voltage generator additionally has a controller which provides a new back-bias control signal by combining the pump control signal from the ring oscillator with the precharge control signal from the ring oscillator and controls a threshold voltage of the precharge transistor with the back-bias control signal.

7 Claims, 16 Drawing Sheets

VOLTAGE GENERATOR

BACKGROUND OF THE INVENTION

1. Field of the Invention

The present invention relates to a voltage generator, more particularly, to a voltage generator which reduces a layout size, reduces a power consumption of a semiconductor device by enhancing a pumping efficiency and a pumping driving ability and generates a cell transistor driving voltage VPP and a substrate bias voltage (called a back bias voltage: VBB).

2. Description of the Prior Art

In general, a cell block of a general DRAM is designed to connect one transistor with one cell capacitor therein. In this case, NMOS transistor is mainly used as the cell transistor because of advantage of area and current driving ability. To read/write a high level data in a cell, a high potential higher than a data potential by a threshold voltage is applied to a gate of a cell transistor. This high potential for driving a cell transistor is called a high voltage VPP, and will now be indicated as a symbol of VPP below.

FIG. 1 is a conventional high voltage generator. As shown in FIG. 1, a detector 10 senses a feedback high voltage VPP level, generates a high voltage pumping enable signal PPE. A ring oscillator 12 functioned as a pump driver receives a high voltage pumping enable signal PPE as an input, and is operated by the high voltage pumping enable signal PPE. A high voltage charge pump unit 14 generates a high voltage VPP by using a coupling capacitor. The high voltage VPP level is fed back to the detector 10, a pumping operation and a pumping stop operation are repeated by the high voltage pumping enable signal PPE, so that the high voltage VPP generator maintains a high voltage VPP level as a desired level.

FIG. 2 is a detailed circuit diagram of the charge pump unit shown in FIG. 1. FIG. 3 is a timing diagram of the charge pump unit shown in FIG. 2. This charge pump unit 14 will be operated as follows.

Referring to FIG. 2, a reference code PL indicates a coupling capacitor driving signal for a high voltage pump at left side of FIG. 2. A reference code pr indicates a coupling capacitor driving signal for a high voltage pump at right side of FIG. 2. A reference code GL indicates a coupling capacitor driving signal for a high voltage pump precharge at left side of FIG. 2. A reference code GR indicates a high voltage pump precharge coupling capacitor driving signal at right side of FIG. 2.

If the high voltage precharge coupling capacitor driving signal GL is changed from a ground potential to a power-supply potential VCC, a node PGL is to be a high level by a coupling capacitor C1 in order to turn on NMOS transistor M1, thereby precharging a node PPL with a power-supply potential VCC. After that, if the high voltage pump precharge driving signal PL is changed from a ground potential to a power-supply potential VCC, the node PPL rises to a potential 2Vcc by a coupling capacitor C3. At this time, if the high voltage pump coupling capacitor driving signal PR is changed from a power-supply potential VCC to a ground potential and turns on PMOS transistor P1 by a coupling capacitor C4, a high voltage VPP potential rises by a charge sharing between a high voltage VPP node and the node PPL.

In this way, if the power-supply potential VCC is applied to a high voltage pump precharge coupling capacitor driving signal GR, NMOS transistor M2 is turned on by the coupling capacitor C2 to precharge a node PPR with a power-supply potential VCC, the node PPR rises to a potential 2Vcc by the high voltage pump coupling capacitor driving signal PR and the coupling capacitor C4 of a node PPR. After that, if a high voltage pump coupling capacitor driving signal PL is changed from the power-supply potential VCC to a ground potential and PMOS transistor P2 is turned on by a coupling capacitor C3, the high voltage VPP potential rises by a charge sharing between a high voltage VPP node and the node PPR.

By repeating the aforementioned operations, the pumping operations are continued until the high voltage VPP potential level rises to a desired level.

FIG. 4 is a block diagram of a conventional substrate bias voltage generator. Referring to FIG. 4, a detector 16 senses a level of a feedback substrate bias voltage VBB, and generates a substrate bias voltage pumping enable signal BBE. A ring oscillator 18 functioned as a pump driver receives a substrate bias voltage pumping enable signal BBE as an input, and is operated by the substrate bias voltage pumping enable signal BBE. A charge pump unit 20 for a substrate bias voltage generates a substrate bias voltage VBB by using a coupling capacitor. The substrate bias voltage VBB level is fed back again to the detector 16, repeats a pumping operation or non-pumping operation by the substrate voltage pumping enable signal BBE, and thus maintains the substrate bias voltage VBB level to a desired level.

FIG. 5 is a detailed circuit diagram of the charge pump unit 20 shown in FIG. 4, and FIG. 6 is a timing diagram of the circuit shown in FIG. 5. The charge pump unit 20 will be operated as follows.

If a coupling capacitor driving signal GL for a substrate bias voltage pump precharge is changed from a power-supply potential VCC to a ground potential, a node PGL is to be a low level by a coupling capacitor C1 in order to turn on PMOS transistor PM1, thereby precharging a node PPL with a ground potential. After that, if a coupling capacitor driving signal PL for a substrate bias voltage pump is changed from a power-supply potential VCC to a ground potential, the node PPL drops to a potential "−VCC" by a coupling capacitor C3. At this time, if a coupling capacitor driving signal PR for a substrate bias voltage pump is changed from a ground potential to a power-supply potential VCC and turns on NMOS transistor NM1 by a coupling capacitor C4, a substrate bias voltage VBB potential drops by a charge sharing between a substrate bias voltage VBB node and the node PPL.

In this way, if the ground potential is applied to a substrate bias voltage pump precharge coupling capacitor driving signal GR, PMOS transistor PM2 is turned on by the coupling capacitor C2 to precharge a node PPR with a ground potential, the node PPR drops to a potential "−VCC" by the substrate bias voltage pump coupling capacitor driving signal PR and the coupling capacitor C4 of a node PPR. After that, if a substrate bias voltage pump coupling capacitor driving signal PL is changed from the ground potential to the power-supply potential VCC and NMOS transistor NM2 is turned on by a coupling capacitor C3, the substrate bias voltage VBB potential drops by a charge sharing between a substrate bias voltage VBB node and the node PPR.

By repeating the aforementioned operations, the pumping operations are continued until the substrate bias voltage VBB level rises to a desired level.

In this case, fully precharging the nodes PPL and PPR with the ground potential is very important to reduce energy loss. For this purpose, sizes of the precharge transistors PM1 and PM2 should be fully enlarged. In addition, to drive such a large-sized transistor, a precharge coupling capacitor's size should be also enlarged. However, under this condition, a pumping efficiency becomes drop.

A leakage current among DRAM's internal currents is comprised of an off-leakage current and a junction leakage current. A cell leakage current is given much weight in a DRAM having many cell transistors. Particularly, the off-leakage current's percentage is higher than that of others. Following the trend that DRAM is manufactured as a large scale integrated circuit IC and as a high integration IC, the number of cells and the number of cell transistors are increased, and a length of the cell transistor is reduced. Accordingly, a percentage of a leakage of the cell transistors becomes more elevated.

SUMMARY OF THE INVENTION

Accordingly, the present invention is directed to a voltage generator that substantially obviates one or more of the problems due to limitations and disadvantages of the related art.

It is an objective of the present invention to provide a voltage generator which considerably reduces a current consumption by increasing a pumping efficiency, and generates a stable cell transistor driving voltage or a stable substrate bias voltage.

To achieve the above objective, in a voltage generator having a charge pump unit which includes a pump transistor for performing a charge pumping operation by a pump control signal from a ring oscillator and a precharge transistor for performing a charge precharge operation by a precharge control signal from the ring oscillator, a voltage generator in accordance with a preferred embodiment of the present invention includes a controller which combines the pump control signal from the ring oscillator with the precharge control signal from the ring oscillator, and controls a back bias of the precharge transistor.

Additional features and advantages of the invention will be set forth in the description that follows, and in part will be apparent from the description, or may be learned by practice of the invention. The objective and other advantages of the invention will be realised and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 1:
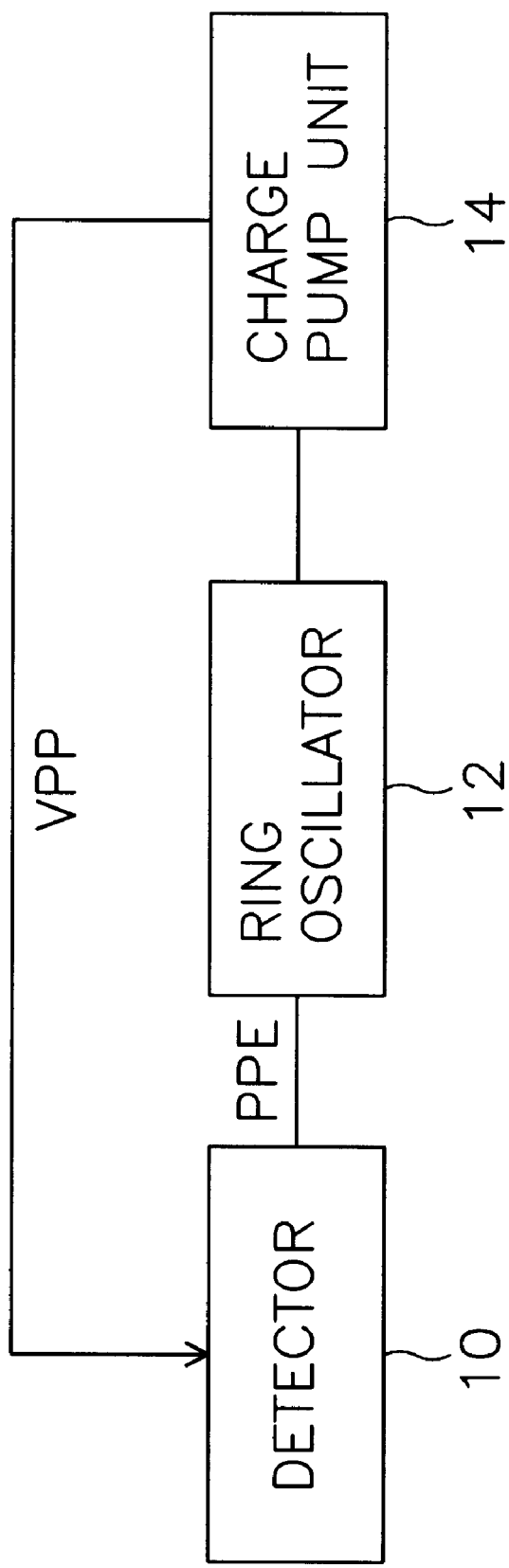
FIG. 1 is a block diagram of a conventional cell transistor driving voltage generator.
Figure 2:
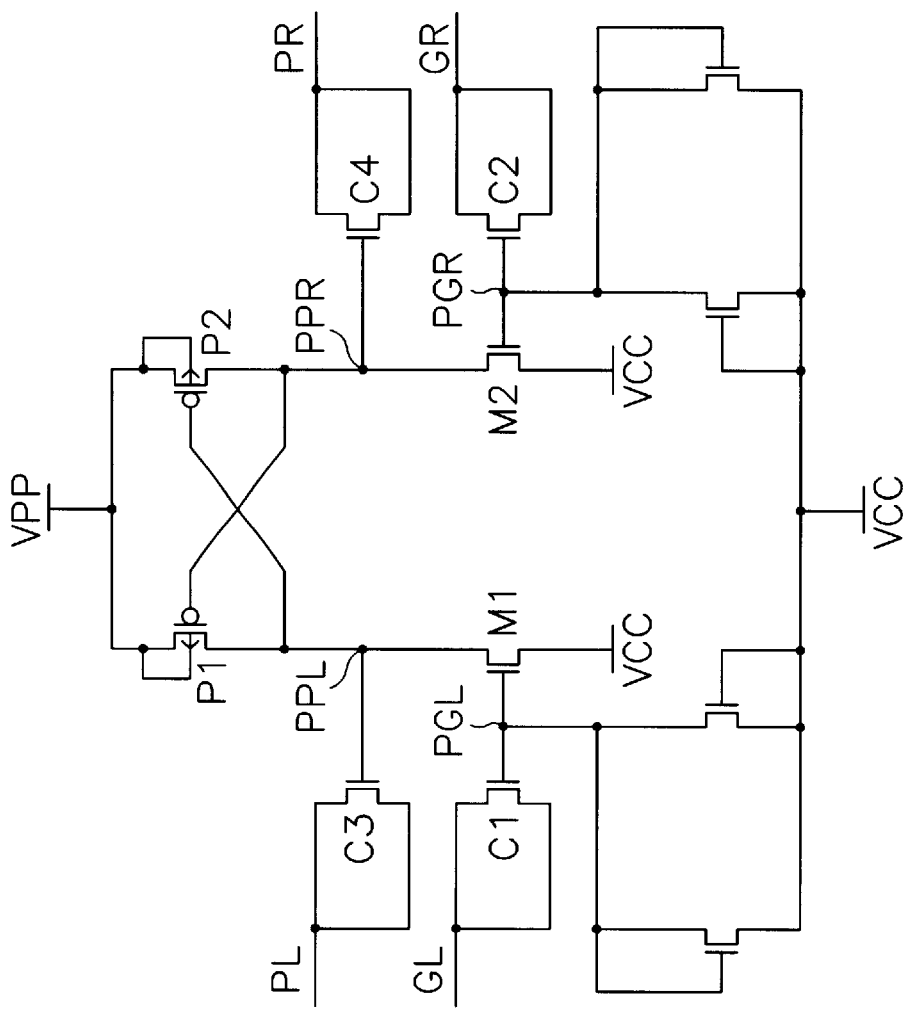
FIG. 2 is a detailed circuit diagram of the charge pump unit shown in FIG. 1.
Figure 3:
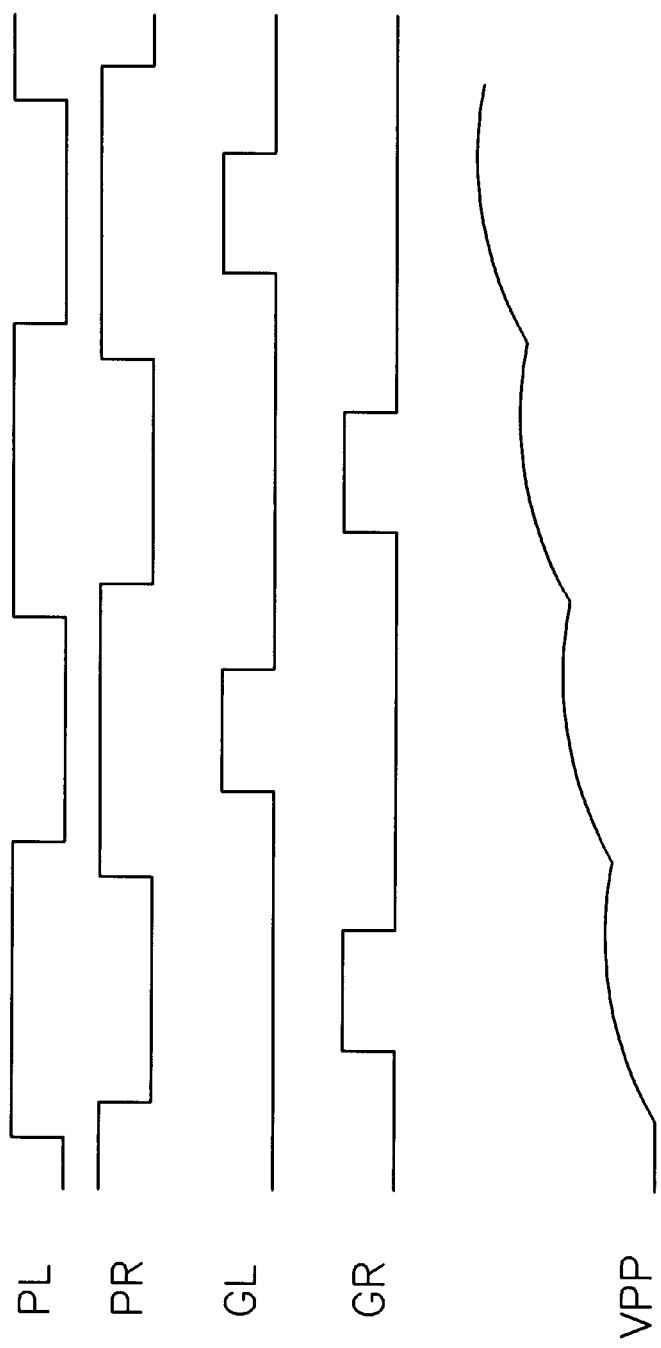
FIG. 3 is a timing diagram of the charge pump unit shown in FIG. 2.
Figure 4:
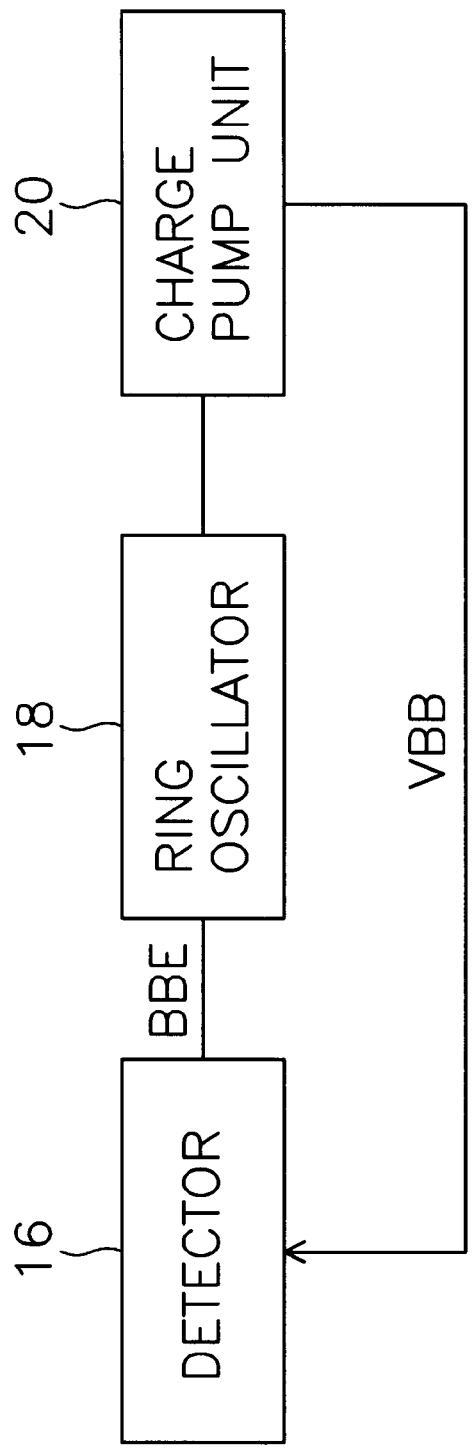
FIG. 4 is a conventional substrate bias voltage generator.
Figure 5:
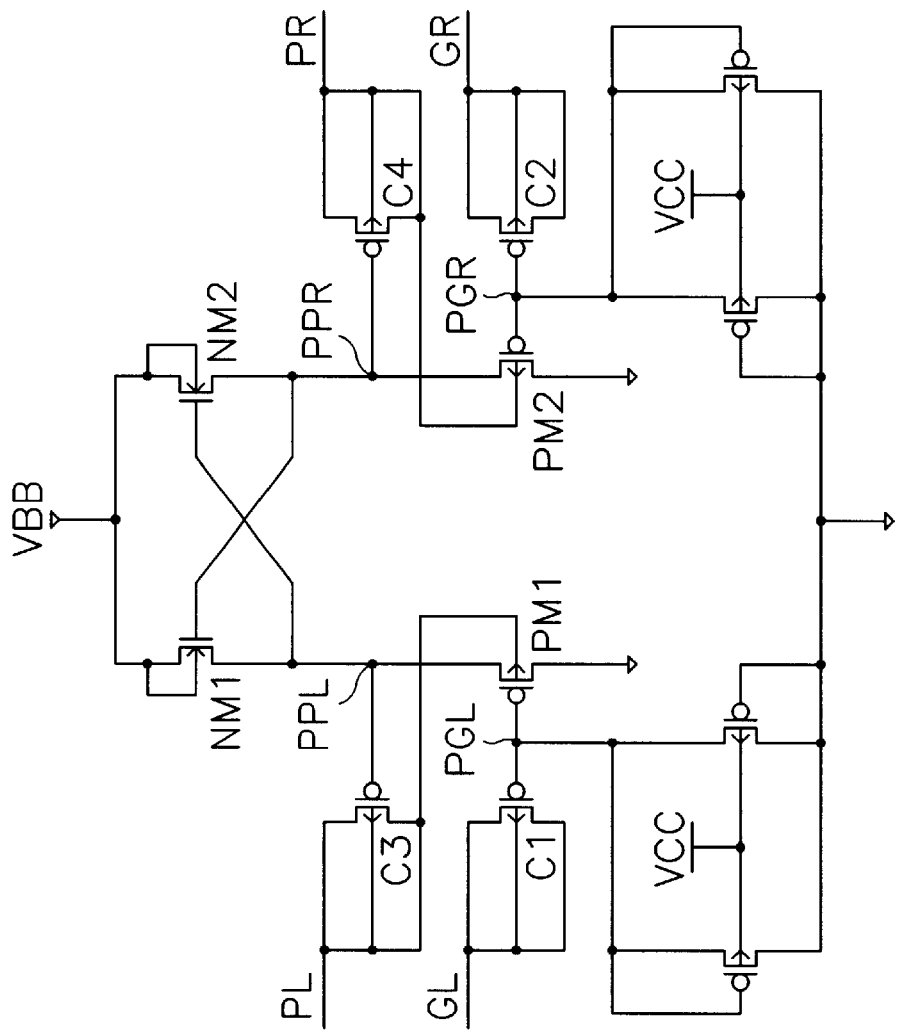
FIG. 5 is a detailed circuit diagram of the charge pump unit shown in FIG. 4.
Figure 6:
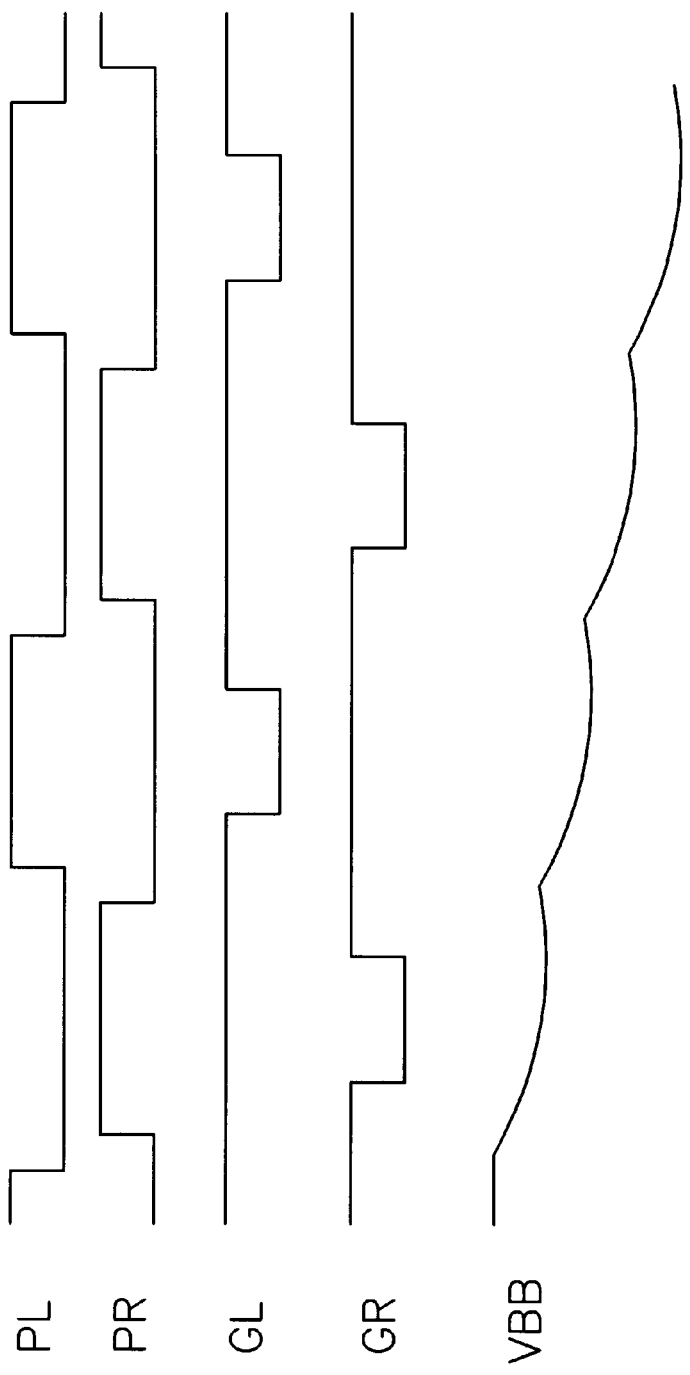
FIG. 6 is a timing diagram of each nodes of FIG. 5.
Figure 7:
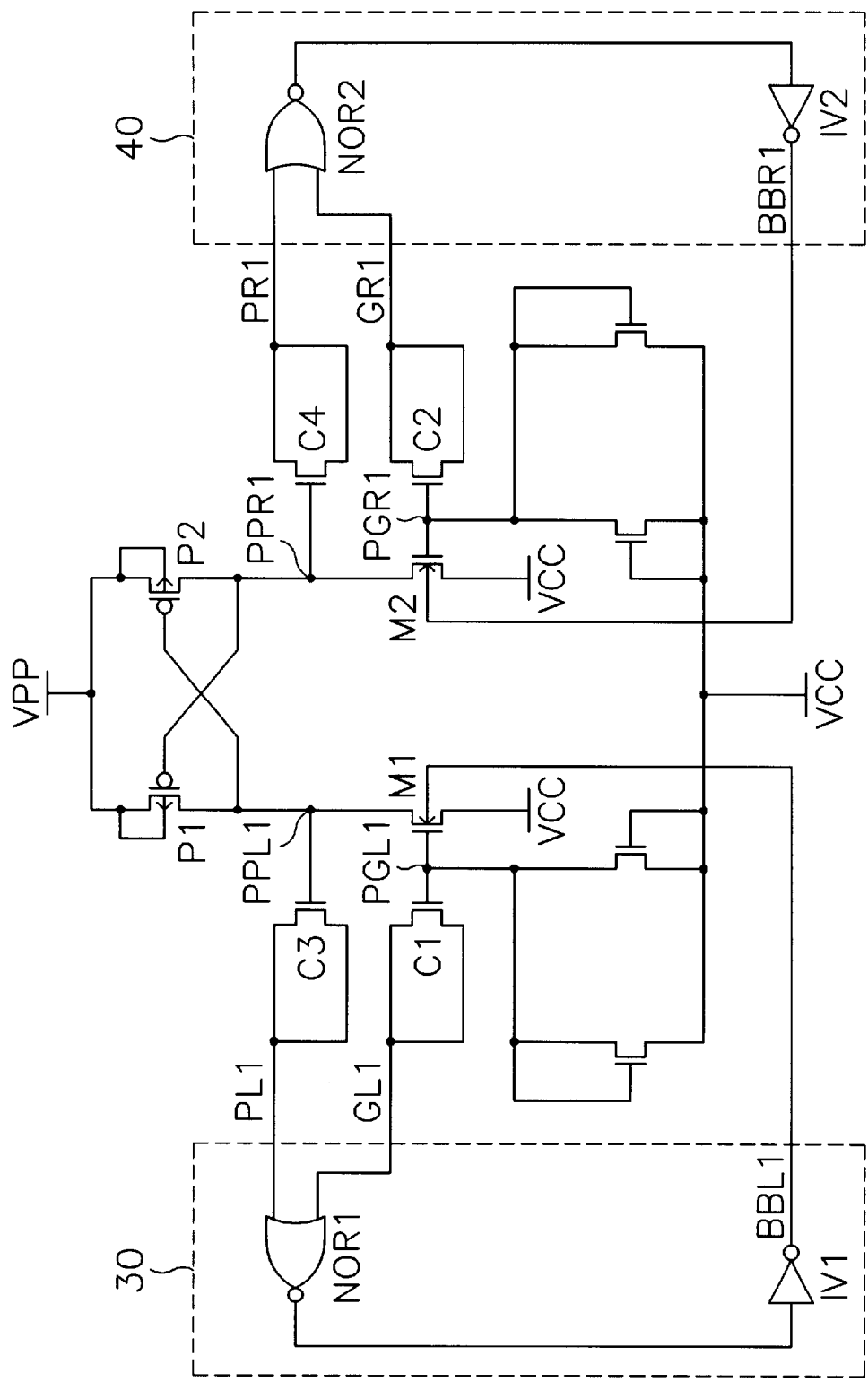
FIG. 7 is a detailed circuit diagram of a cell transistor driving voltage generator in accordance with a preferred embodiment of the present invention.

FIG. 7 is a detailed circuit diagram of a cell transistor driving voltage generator in accordance with a preferred embodiment of the present invention.

As shown in FIG. 7, as compared with the conventional cell transistor driving voltage generator, the inventive cell transistor driving voltage generator further includes controllers 30 and 40. In the same way of the conventional art, the inventive cell transistor driving voltage generator includes a ring oscillator for detecting a high voltage VPP level, a ring oscillator being operated by a control signal from the detector, and a charge pump unit for performing a pumping operation to a desired high voltage VPP level by a control signal from the ring oscillator. Further to this configuration, the inventive cell transistor driving voltage generator includes the controllers 30 and 40 between the ring oscillator and the charge pump unit. The controllers 30 and 40 control a back bias of a precharge transistor inside of the charge pump unit according to a control signal provided from the ring oscillator.

That is, the high voltage charge pump unit includes precharge transistors M1 and M2, and transistors P1 and P2. The precharge transistor M1 is controlled by a high voltage pump precharge coupling capacitor driving signal GL1. The precharge transistor M2 is controlled by a high voltage pump precharge coupling capacitor driving signal GR1. The transistor P1 is connected between the precharge transistor M1 and the high voltage VPP node, and transmits a high voltage pumping level to the high voltage VPP node. The transistor P2 is connected between the transistor M2 and the high voltage VPP node, and transmits a high voltage pumping level to the high voltage VPP node.

A high voltage pump coupling capacitor driving signal PL1 is applied on a connection node PPL1, i.e. a high voltage pumping node, between the transistors P1 and M1 via a coupling capacitor C3. A high voltage pump coupling capacitor driving signal PR1 is applied on a connection node PPR1, i.e. a high voltage pumping node, between the transistors P2 and M2 via a coupling capacitor C4.

The controller 30 includes a NOR gate NOR1 and an inverter IV1. The NOR gate NOR1 performs a NOR logic operation about the high voltage pump coupling capacitor driving signal PL1 and the high voltage pump precharge coupling capacitor driving signal GL1. The inverter IV1 inverts an output of the NOR gate NOR1, and provides it to a back bias terminal of the precharge transistor M1.

The controller 40 includes a NOR gate NOR2 and an inverter IV2. The NOR gate NOR2 performs a NOR logic operation about the high voltage pump coupling capacitor driving signal PR1 and the high voltage pump precharge coupling capacitor driving signal GR1. The inverter IV2 inverts an output of the NOR gate NOR2, and provides it to a back bias terminal of the precharge transistor M2.

Figure 8:
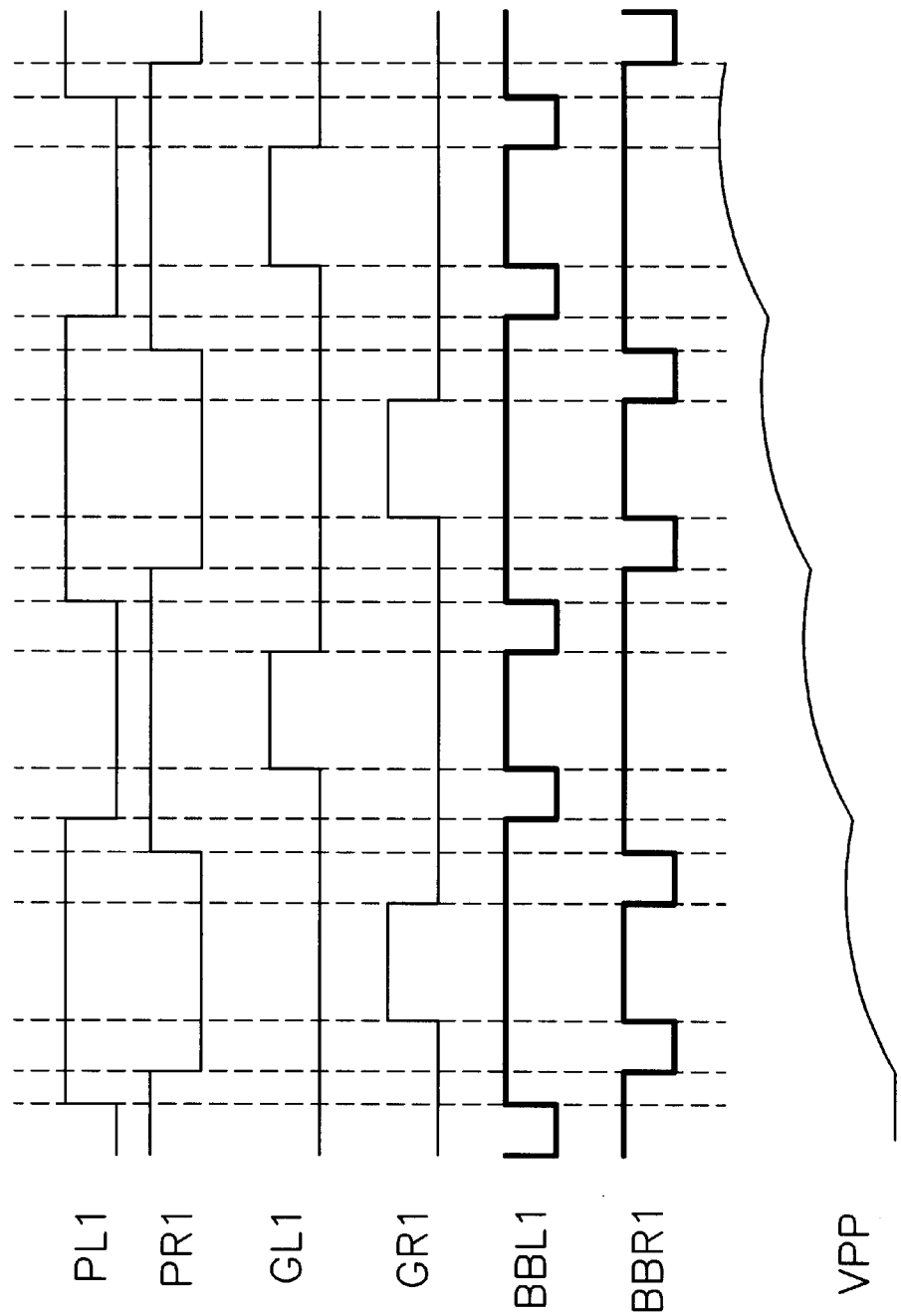
FIG. 8 is a timing diagram of the circuit shown in FIG. 7.

The voltage generator shown in FIG. 7 will be operated as follows. The operations of the voltage generator of FIG. 7 will now be described with reference to FIG. 8 showing a timing diagram of the circuit of FIG. 7.

If a high voltage pump precharge coupling capacitor driving signal GL1 is changed from a ground potential to a power-supply potential VCC, a node PGL1 is to be a high level by a coupling capacitor C1 in order to turn on NMOS transistor M1 being a precharge transistor, thereby precharging a node PPL1 with a power-supply potential VCC. After that, if a high voltage pump coupling capacitor driving signal PL1 is changed from a ground potential to a power-supply potential VCC, the node PPL1 rises to a potential "2VCC" by a coupling capacitor C3. At this time, if a high voltage pump coupling capacitor driving signal PR1 is changed from a power-supply potential VCC to a ground potential and turns on PMOS transistor P1 by a coupling capacitor C4, a potential VPP is increased by a charge sharing between a node VPP and the node PPL1.

In this way, if the power-supply potential VCC is applied to a high voltage pump precharge coupling capacitor driving signal GR1, NMOS transistor M2 being a precharge transistor is turned on by the coupling capacitor C2 to precharge a node PPR1 with a power-supply potential VCC, the node PPR1 rises to a potential "2VCC" by a high voltage pump coupling capacitor driving signal PR1 and the coupling capacitor C4 of the node PPR1. After that, if a high voltage pump coupling capacitor driving signal PL1 is changed from the power-supply potential VCC to the ground potential and PMOS transistor P2 is turned on by a coupling capacitor C3, the voltage VPP potential rises by a charge sharing between a node VPP and the node PPR1. In the meantime, when the node PPR1 is precharged with the power-supply potential VCC, the node PPL1 is at a high level to turn off PMOS transistor P2, and the nodes VPP and PPR1 are at a cut-off state.

By repeating the aforementioned operations, the pumping operations are continued until the voltage VPP level rises to a desired level.

Referring to FIG. 7, when precharging the nodes PPL1 and PPR1 with a power-supply node VCC, in order to fully precharge the nodes PPL1 and PPR1 by a power-supply potential VCC simultaneously with reducing energy loss, the first controller 30 performs a NOR logic operation about a high voltage pump coupling capacitor driving signal PL1 and a high voltage pump precharge coupling capacitor driving signal GL1 by using the NOR gate NOR1, and transmits an output signal of the NOR gate NOR1 to a back bias terminal of a precharge transistor M1 via the inverter IV1. The second controller 40 performs a NOR logic operation about a high voltage pump coupling capacitor driving signal PR1 and a high voltage pump precharge coupling capacitor driving signal GR1 by using the NOR gate NOR2, and transmits an output signal of the NOR gate NOR2 to a back bias terminal of a precharge transistor M2 via the inverter IV2.

As a result, a pumping operation of the inventive voltage generator is the same as a conventional VPP pump structure. In case of a precharge operation, back bias, i.e., bulk bias, terminals of the precharge transistors M1 and M2 are to have a power-supply potential VCC at a turn-on time point of the precharge transistors M1 and M2. At this time, a turn-on time point of the transistor M1 may be identical with that of the transistor M2, or the transistors M1 and M2 may be sequentially turned on. Therefore, a threshold voltage of the precharge transistors M1 and M2 is reduced. At the same time, a current supply is made through a pn-junction being connected from a bulk of the precharge transistors M1 and M2 to the nodes PPL1 and PPR1, so that a precharging operation is more quickly achieved without enlarging the sizes of the precharge coupling capacitors C1 and C2.

Figure 9:
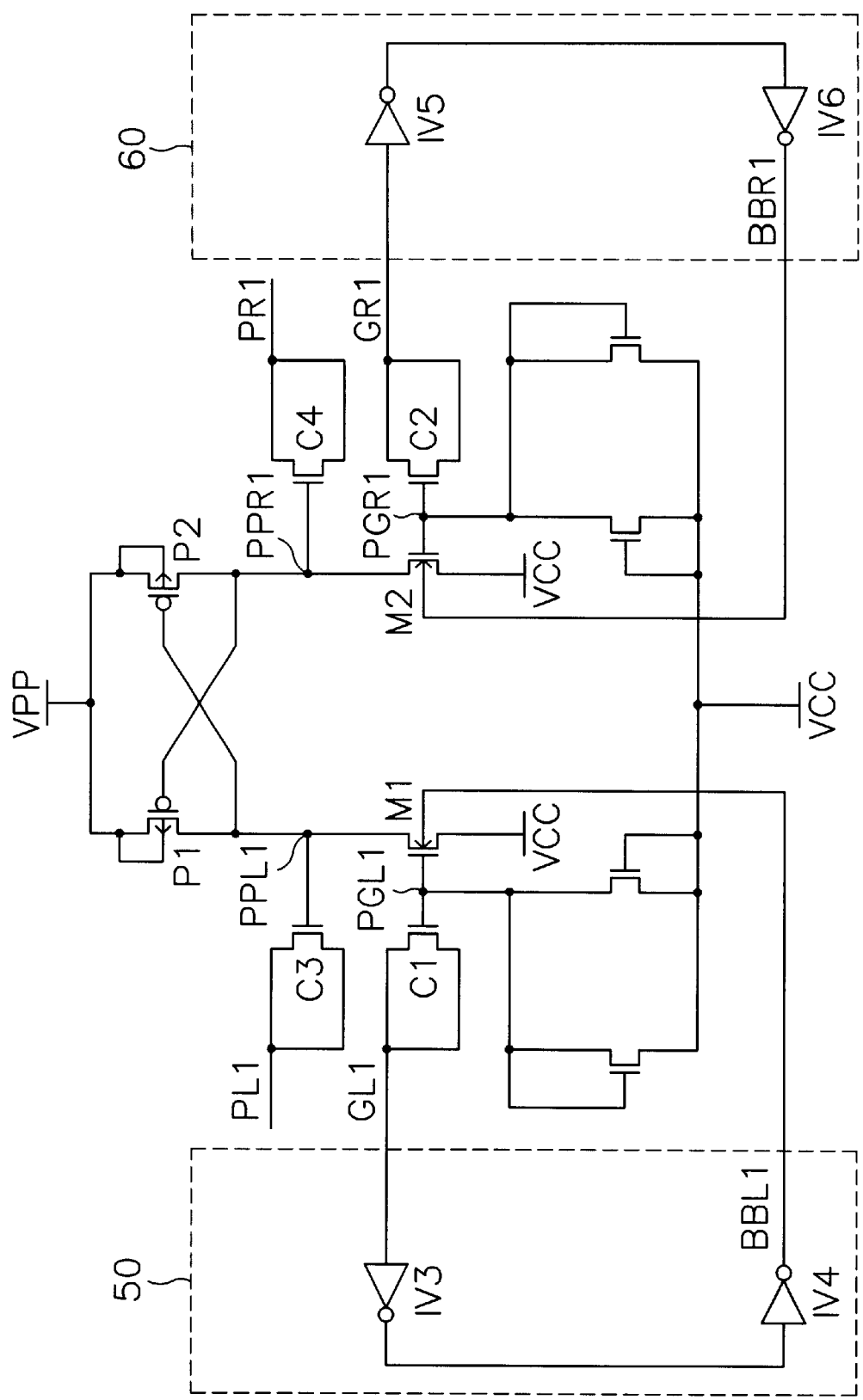
FIG. 9 is a detailed circuit diagram of a cell transistor driving voltage generator in accordance with another preferred embodiment of the present invention.

FIG. 9 is a detailed circuit diagram of a cell transistor driving voltage generator in accordance with another preferred embodiment of the present invention. A configuration of FIG. 9 is similar to that of FIG. 7, but further includes first and second controllers 50 and 60 as compared with FIG. 7.

As shown in FIG. 9, a first controller 50 includes two inverters IV3 and IV4. The inverter IV3 inverts a high voltage pump precharge coupling capacitor driving signal GL1. The inverter IV4 inverts an output signal of the inverter IV3, and then transmits it to a back bias terminal of the precharge transistor M1 of a charge pump unit.

A second controller 60 includes two inverters IV5 and IV6. The inverter IV5 inverts a high voltage pump precharge coupling capacitor driving signal GR1. The inverter IV6 inverts an output of the inverter IV5, and then applies it to a back bias terminal of the precharge transistor M2 of the charge pump unit.

Figure 10:
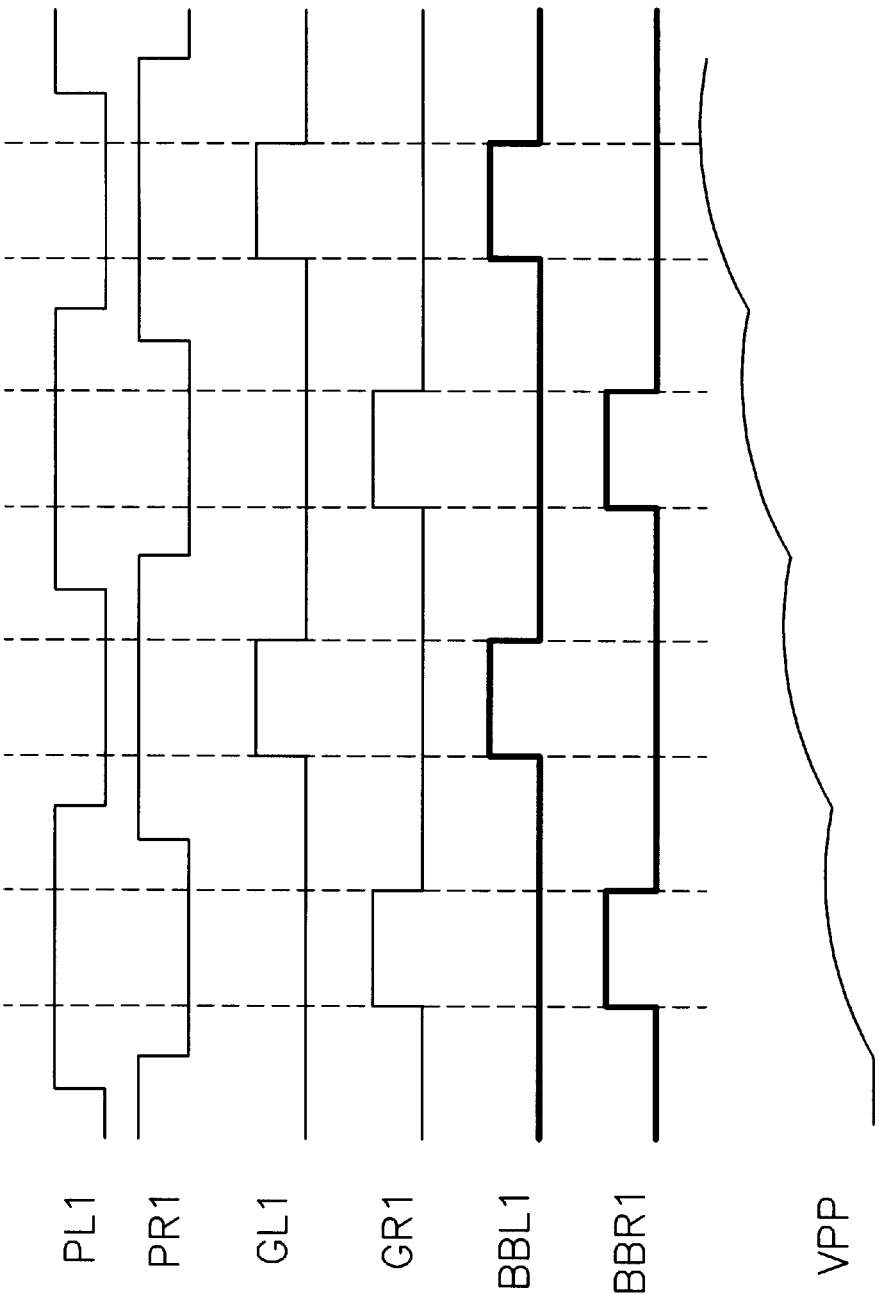
FIG. 10 is a timing diagram of the circuit shown in FIG. 9.

The voltage generator shown in FIG. 9 will be operated as follows. The operations of the voltage generator of FIG. 9 will now be described with reference to FIG. 10 showing a timing diagram of the circuit of FIG. 9.

If a high voltage pump precharge coupling capacitor driving signal GL1 is changed from a ground potential to a power-supply potential VCC, a node PGL1 is to be a high level by a coupling capacitor C1 in order to turn on NMOS transistor M1 being a precharge transistor, thereby precharging a node PPL1, i.e., a high voltage pumping node, with a power-supply potential VCC. After that, if a high voltage pump coupling capacitor driving signal PL1 is changed from a ground potential to a power-supply potential VCC, the node PPL1 rises to a potential "2VCC" by a coupling capacitor C3. At this time, if a high voltage pump coupling capacitor driving signal PR1 is changed from a power-supply potential VCC to a ground potential and turns on PMOS transistor P1 by a coupling capacitor C4, a potential VPP is increased by a charge sharing between a node VPP and the node PPL1.

In this way, if the power-supply potential VCC is applied to a high voltage pump precharge coupling capacitor driving signal GR1, NMOS transistor M2 being a precharge transistor is turned on by the coupling capacitor C2 to precharge a node PPR1 with a power-supply potential VCC, the node PPR1 rises to a potential "2VCC" by a high voltage pump coupling capacitor driving signal PR1 and the coupling capacitor C4 of the node PPR1. After that, if a high voltage pump coupling capacitor driving signal PL1 is changed from the power-supply potential VCC to the ground potential and PMOS transistor P2 is turned on by a coupling capacitor C3, the voltage VPP potential rises by a charge sharing between a node VPP and the node PPR1. In the meantime, when the node PPR1 is precharged with the power-supply potential VCC, the node PPL1 is at a high level to turn off PMOS transistor P2, and the nodes VPP and ppr1 are at a cut-off state.

By repeating the aforementioned operations, the pumping operations are continued until the voltage VPP level rises to a desired level.

Referring to FIG. 9, when precharging the nodes PPL1 and PPR1 are precharged with a power-supply potential VCC, in order to fully precharge the nodes PPL1 and PPR1 by the power-supply potential VCC simultaneously with reducing energy loss, the first controller 50 buffers a high voltage pump precharge coupling capacitor driving signal GL1, and applies it to a bulk terminal of the precharge transistor M1. The controller 60 buffers a high voltage pump precharge coupling capacitor driving signal GR1, and applies it to a bulk terminal of a precharge transistor M2.

As a result, a pumping operation of the inventive voltage generator is the same as a conventional VPP pump structure. In case of a precharge operation, back bias, i.e., bulk bias, terminals of the precharge transistors M1 and M2 are to have a power-supply potential VCC at a turn-on time point of the precharge transistors M1 and M2. At this time, a turn-on time point of the transistor M1 may be identical with that of the transistor M2, or the transistors M1 and M2 may be sequentially turned on. Therefore, a threshold voltage of the precharge transistors M1 and M2 is reduced. At the same time, a current supply is made through a pn-junction being connected from a bulk of the precharge transistors M1 and M2 to the nodes PPL1 and PPR1, so that a precharging operation is more quickly achieved without enlarging the sizes of the precharge coupling capacitors C1 and C2.

If the nodes PPL1 and PPR1 are at a low level, the voltage generator of FIG. 7 uses a bulk bias of a precharge transistor as a low level, and therefore reduces a leakage current of the nodes PPL1 and PPR1. FIG. 9 does not show such a signal.

Figure 11:
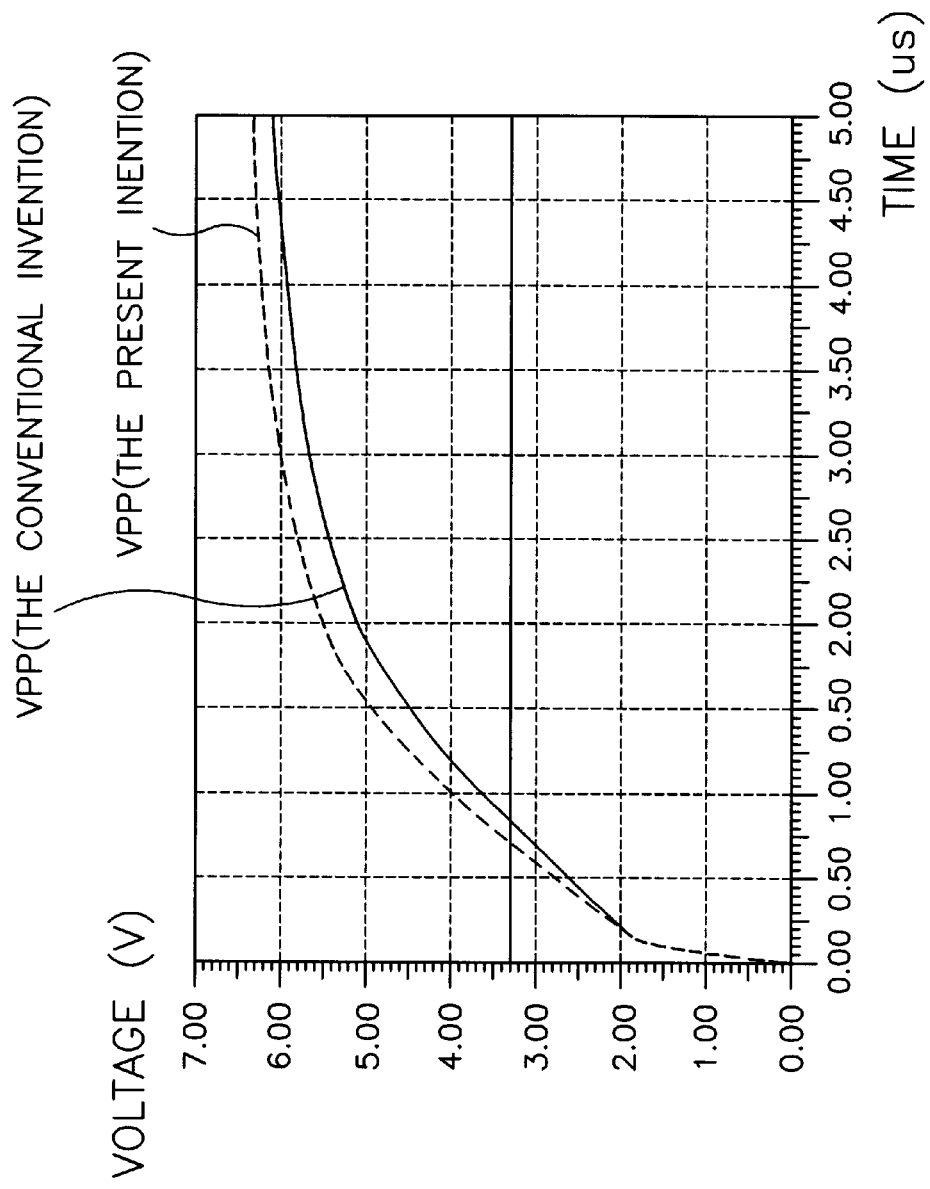
FIG. 11 depicts a simulation waveform diagram for comparing a preferred embodiment of the present invention with a conventional art.

In case of using the high voltage VPP generators in the aforementioned preferred embodiments, a configuration of the preferred embodiments of the present invention is better than that of the conventional art, thereby achieving a pumping efficiency and a pumping driving ability, as shown in FIG. 11 which depicts a simulation waveform diagram for comparing a preferred embodiment of the present invention with a conventional art.

Figure 12:
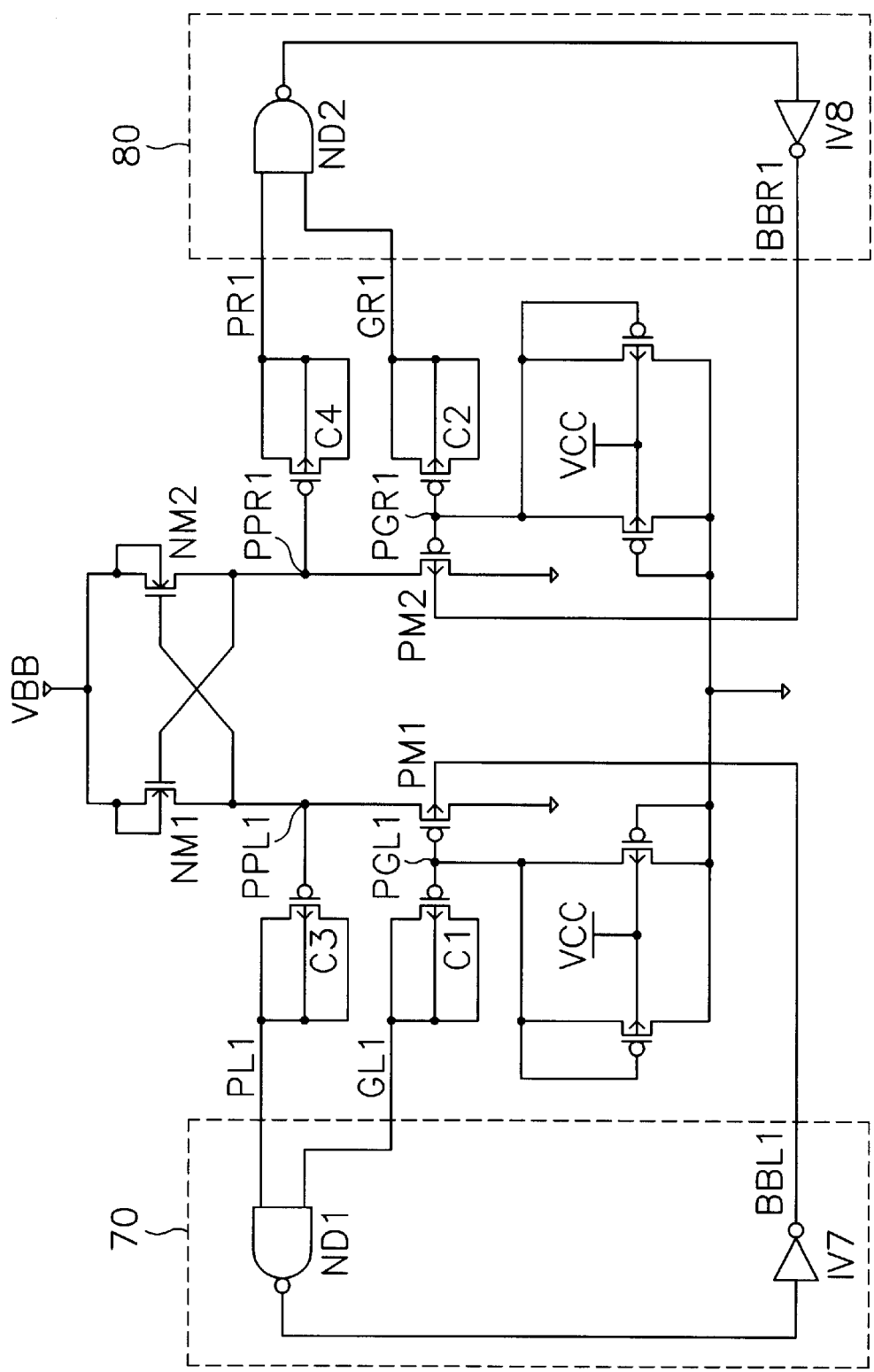
FIG. 12 is a detailed circuit diagram of a substrate bias voltage generator in accordance with a third preferred embodiment of the present invention.

FIG. 12 is a detailed circuit diagram of a substrate bias voltage generator in accordance with a third preferred embodiment of the present invention.

As shown in FIG. 12, as compared with the conventional art, the inventive substrate bias voltage generator further includes controllers 70 and 80. In the same way of the conventional art, the inventive substrate bias voltage generator includes a ring oscillator for detecting a voltage VBB level, a ring oscillator being operated by a control signal from the detector, and a charge pump unit for performing a pumping operation to a desired substrate bias voltage VBB level by a control signal from the ring oscillator. Further to this configuration, the inventive substrate bias voltage generator includes the controllers 70 and 80 between the ring oscillator and the charge pump unit. The controllers 70 and 80 control a back bias of a precharge transistor inside of the charge pump unit according to a control signal provided from the ring oscillator.

That is, the substrate bias voltage charge pump unit includes precharge transistors PM1 and PM2, and transistors NM1 and NM2. The precharge transistor PM1 is controlled by a substrate bias voltage pump precharge coupling capacitor driving signal GL1. The precharge transistor PM2 is controlled by a substrate bias voltage pump precharge coupling capacitor driving signal GR1. The transistor NM1 is connected between the precharge transistor PM1 and the voltage VBB node, and transmits a substrate bias voltage pumping level to the voltage VBB node. The transistor NM2 is connected between the transistor PM2 and the voltage VBB node, and transmits a substrate bias voltage pumping level to the voltage VBB node.

A substrate bias voltage pump coupling capacitor driving signal PL1 is applied on a connection node PPL1, i.e., a substrate bias voltage pumping node, between the transistors NM1 and PM1 via a coupling capacitor C3. A substrate bias voltage pump coupling capacitor driving signal PR1 is applied on a connection node PPR1, i.e., a substrate bias voltage pumping node, between the transistors NM2 and PM2 via a coupling capacitor C4.

The controller 70 includes a NAND gate ND1 and an inverter IV7. The NAND gate ND1 performs a NAND logic operation about the substrate bias voltage pump coupling capacitor driving signal PL1 and the substrate bias voltage pump precharge coupling capacitor driving signal GL1. The inverter IV7 inverts an output of the NAND gate ND1, and provides it to a back bias terminal of the precharge transistor PM1.

The controller 80 includes a NAND gate ND2 and an inverter IVB. The NAND gate ND2 performs a NAND logic operation about the substrate bias voltage pump coupling capacitor driving signal PR1 and the substrate bias voltage pump precharge coupling capacitor driving signal GR1. The inverter IV8 inverts an output of the NAND gate ND2, and provides it to a back bias terminal of the precharge transistor PM2.

Figure 13:
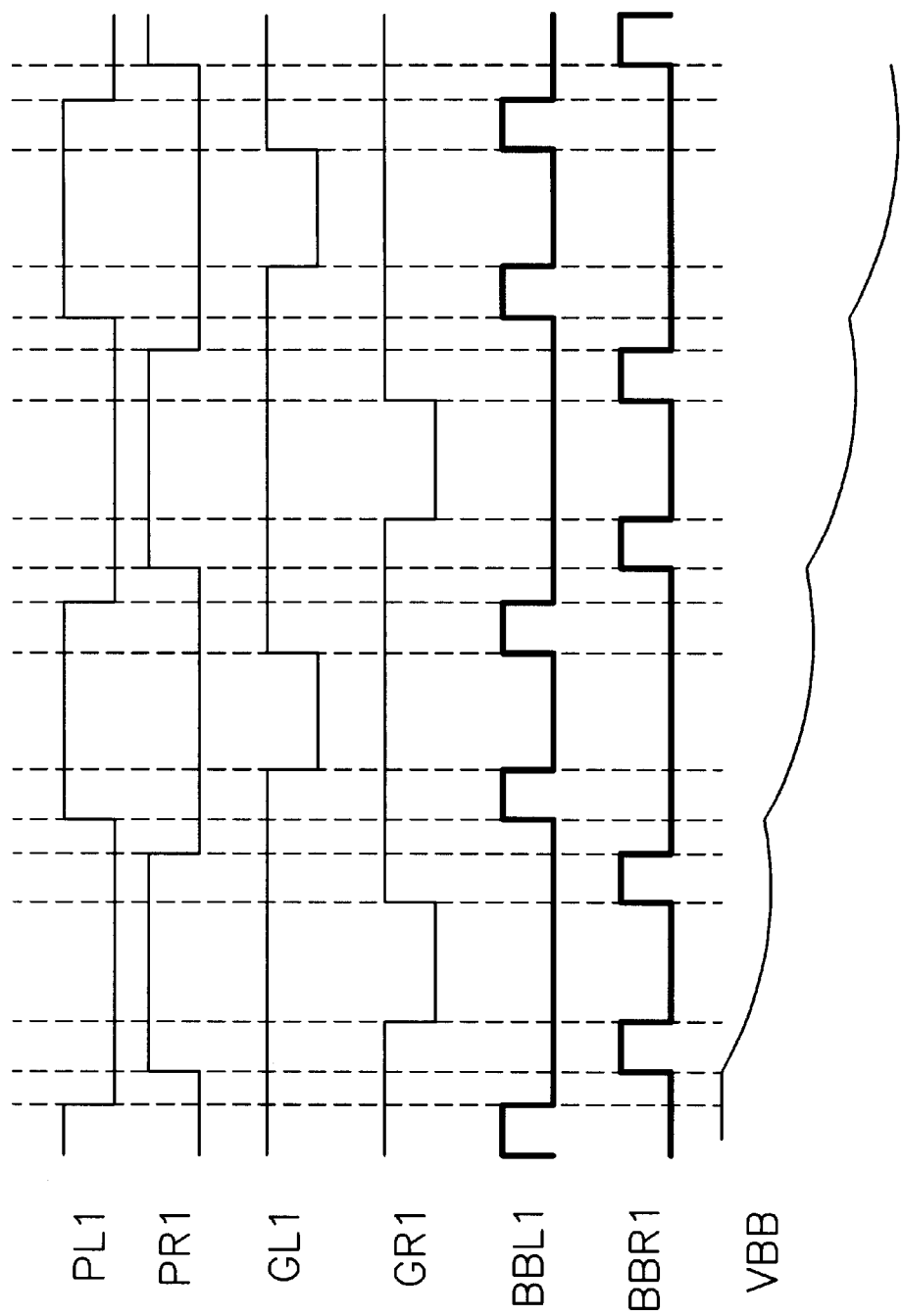
FIG. 13 is a timing diagram of the circuit shown in FIG. 12.

The voltage generator shown in FIG. 12 will be operated as follows. The operations of the voltage generator of FIG. 12 will now be described with reference to FIG. 13 showing a timing diagram of the circuit of FIG. 12.

If a substrate bias voltage precharge coupling capacitor driving signal GL1 is changed from a power-supply potential VCC to a ground potential, a node PGL1 is to be a low level by a coupling capacitor C1 in order to turn on PMOS transistor PM1, thereby precharging a node PPL1 with a ground potential. After that, if a substrate bias voltage pump coupling capacitor driving signal PL1 is changed from a power-supply potential VCC to a ground potential, the node PPL1 drops to a potential "−VCC" by a coupling capacitor C3. At this time, if a substrate bias voltage pump coupling capacitor driving signal PR1 is changed from a ground potential to a power-supply potential VCC and turns on NMOS transistor NM1 by a coupling capacitor C4, a potential VBB is reduced by a charge sharing between a node VBB and the node PPL1.

In this way, if the ground potential is applied to a susbtrate bias voltage precharge coupling capacitor driving signal GR1, PMOS transistor PM2 is turned on by the coupling capacitor C2 to precharge a node PPR1 with a power-supply potential VCC, the node PPR1 drops to a potential "−VCC" by a substrate bias voltage pump coupling capacitor driving signal PR1 and the coupling capacitor C4 of the node PPR1. After that, if a substrate bias voltage pump coupling capacitor driving signal PL1 is changed from the ground potential to the power-supply potential VCC and NMOS transistor NM2 is turned on by a coupling capacitor C3, the voltage VBB potential drops by a charge sharing between a node VBB and the node PPR1. In the meantime, when the node PPR1 is precharged with the power-supply potential VCC, the node PPL1 is at a low level to turn off NMOS transistor NM2, and the nodes VBB and ppr1 are at a cut-off state.

By repeating the aforementioned operations, the pumping operations are continued until the voltage VBB level rises to a desired level.

Referring to FIG. 12, when precharging the nodes PPL1 and PPR1 with a power-supply node VCC, in order to fully precharge the nodes PPL1 and PPR1 by the ground potential simultaneously with reducing energy loss, the first controller 70 performs a NAND logic operation about a substrate bias voltage pump coupling capacitor driving signal PL1 and a substrate bias voltage precharge coupling capacitor driving signal GL1 by using the NAND gate ND1, and transmits an output signal of the NAND gate ND1 to a bulk terminal of a precharge transistor PM1 via the inverter IV7. The second controller 80 performs a NAND logic operation about a substrate bias voltage pump coupling capacitor driving signal PR1 and a substrate bias voltage pump precharge coupling capacitor driving signal GR1 by using the NAND gate ND2, and transmits an output signal of the NOR gate NOR2 to a bulk terminal of a precharge transistor PM2 via the inverter IV8.

As a result, a pumping operation of the inventive voltage generator is the same as a conventional VBB pump structure. In case of a precharge operation, back bias, i.e., bulk bias, terminals of the precharge transistors PM1 and PM2 are to have a ground potential at a turn-on time point of the precharge transistors PM1 and PM2. At this time, a turn-on time point of the transistor PM1 may be identical with that of the transistor PM2, or the transistors PM1 and PM2 maybe sequentially turned on. Therefore, a threshold voltage of the precharge transistors PM1 and PM2 is reduced. At the same time, a current supply is made through a pn-junction being connected from the nodes PPL1 and PPR1 to a bulk of the precharge transistors PM1 and PM2, so that a precharging operation is more quickly achieved without enlarging the sizes of the precharge coupling capacitors Cl and C2.

Figure 14:
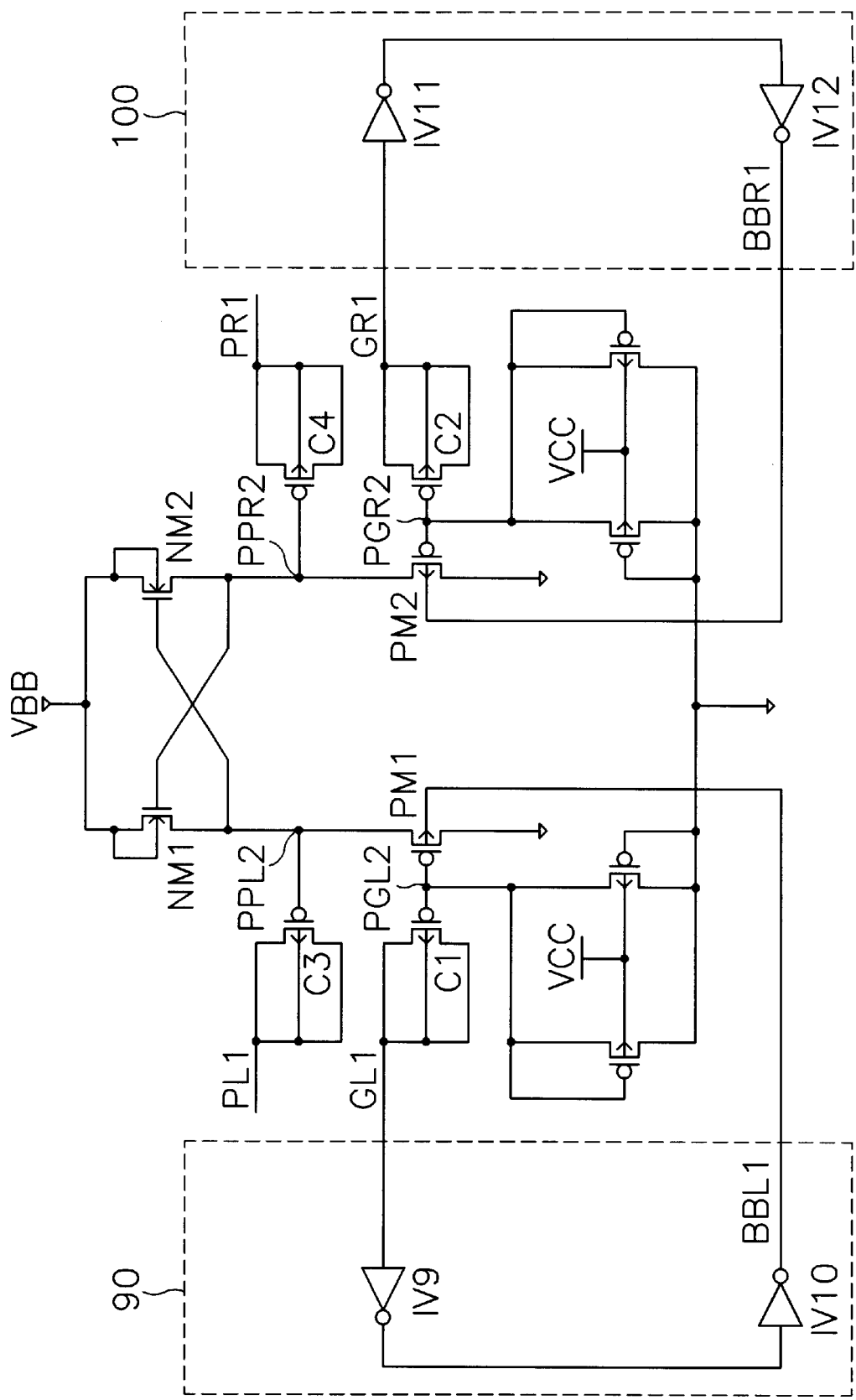
FIG. 14 is a detailed circuit diagram of a substrate bias voltage generator in accordance with a fourth another preferred embodiment of the present invention.

FIG. 14 is a detailed circuit diagram of a substrate bias voltage generator in accordance with another preferred embodiment of the present invention. A configuration of FIG. 14 is similar to that of FIG. 12, but further includes first and second controllers 90 and 100 as compared with FIG. 12.

As shown in FIG. 14, a first controller 90 includes a plurality of inverters IV9 and IV10. The inverter IV9 inverts a substrate bias voltage pump precharge coupling capacitor driving signal GL1. The inverter IV10 inverts an output signal of the inverter IV9, and then transmits it to a back bias terminal of the precharge transistor PM1 of a charge pump unit.

A second controller 100 includes two inverters IV11 and IV12. The inverter IV11 inverts a substrate bias voltage pump precharge coupling capacitor driving signal GR1. The inverter IV12 inverts an output of the inverter IV11, and then applies it to a back bias terminal of the precharge transistor PM2 of the charge pump unit.

Figure 15:
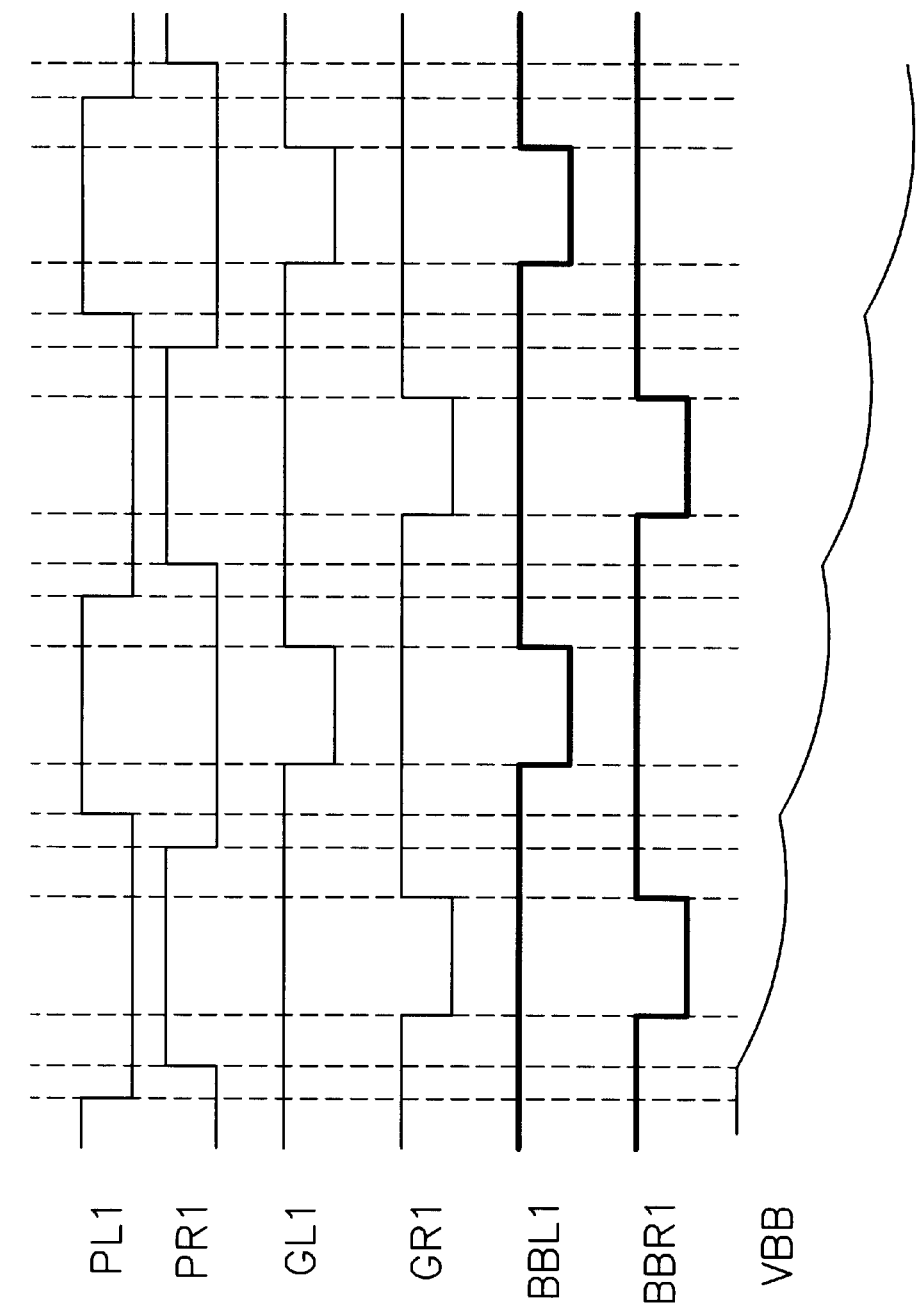
FIG. 15 is a timing diagram of the circuit shown in FIG. 14.

The voltage generator shown in FIG. 14 will be operated as follows. The operations of the voltage generator of FIG. 14 will now be described with reference to FIG. 15 showing a timing diagram of the circuit of FIG. 14.

If a substrate bias voltage precharge coupling capacitor driving signal GL1 is changed from a power-supply potential VCC to a ground potential, a node PGL2 is to be a low level by a coupling capacitor C1 in order to turn on PMOS transistor PM1, thereby precharging a node PPL2, i.e., substrate bias voltage pumping node, with a ground potential. After that, if a substrate bias voltage pump coupling capacitor driving signal PL1 is changed from a power-supply potential VCC to a ground potential, the node PPL2 drops to a potential "−VCC" by a coupling capacitor C3. At this time, if a substrate bias voltage pump coupling capacitor driving signal PR1 is changed from a ground potential to a power-supply potential VCC and turns on NMOS transistor NM1 by a coupling capacitor C4, a potential VBB is reduced by a charge sharing between a node VBB and the node PPL2.

In this way, if the ground potential is applied to a substrate bias voltage pump precharge coupling capacitor driving signal GR1, PMOS transistor PM2 is turned on by the coupling capacitor C2 to precharge a node PPR2 with a ground potential, the node PPR2 drops to a potential "−VCC" by a substrate bias voltage pump coupling capacitor driving signal PR1 and the coupling capacitor C4 of the node PPR2. After that, if a substrate bias voltage pump coupling capacitor driving signal PL1 is changed from the ground potential to the power-supply potential VCC and NMOS transistor NM2 is turned on by a coupling capacitor C3, the voltage VBB potential is reduced by a charge sharing between a node VBB and the node PPR2. In the meantime, when the node PPR2 is precharged with the ground potential, the node PPL2 is at a low level to turn off NMOS transistor NM2, and the nodes VBB and ppr2 are at a cut-off state.

By repeating the aforementioned operations, the pumping operations are continued until the voltage VBB level rises to a desired level.

Referring to FIG. 14, when precharging the nodes PPL2 and PPR2 are precharged with a ground potential, in order to fully precharge the nodes PPL2 and PPR2 by the ground potential simultaneously with reducing energy loss, the first controller 90 buffers a substrate bias voltage pump precharge coupling capacitor driving signal GL1, and applies it to a bulk terminal of the precharge transistor PM1. The controller 100 buffers a substrate bias voltage pump precharge coupling capacitor driving signal GR1, and applies it to a back bias terminal of a precharge transistor PM2.

As a result, a pumping operation of the inventive voltage generator is the same as a conventional VBB pump structure. In case of a precharge operation, back bias, i.e., bulk bias, terminals of the precharge transistors PM1 and PM2 are to have a ground potential at a turn-on time point of the precharge transistors PM1 and PM2. At this time, a turn-on time point of the transistor PM1 may be identical with that of the transistor PM2, or the transistors PM1 and PM2 may be sequentially turned on. Therefore, a threshold voltage of the precharge transistors PM1 and PM2 is reduced. At the same time, a current subtraction is made through a pn-junction being connected from the nodes PPL2 and PPR2 to a bulk of the precharge transistors PM1 and PM2, so that a precharging operation is more quickly achieved without enlarging the sizes of the precharge coupling capacitors C1 and C2.

If the nodes PPL2 and PPR2 are at a high level, the voltage generator of FIG. 12 uses a bulk bias of a precharge transistor as a high level, and therefore reduces a leakage current of the nodes PPL2 and PPR2. FIG. 14 does not show such a signal.

Figure 16:
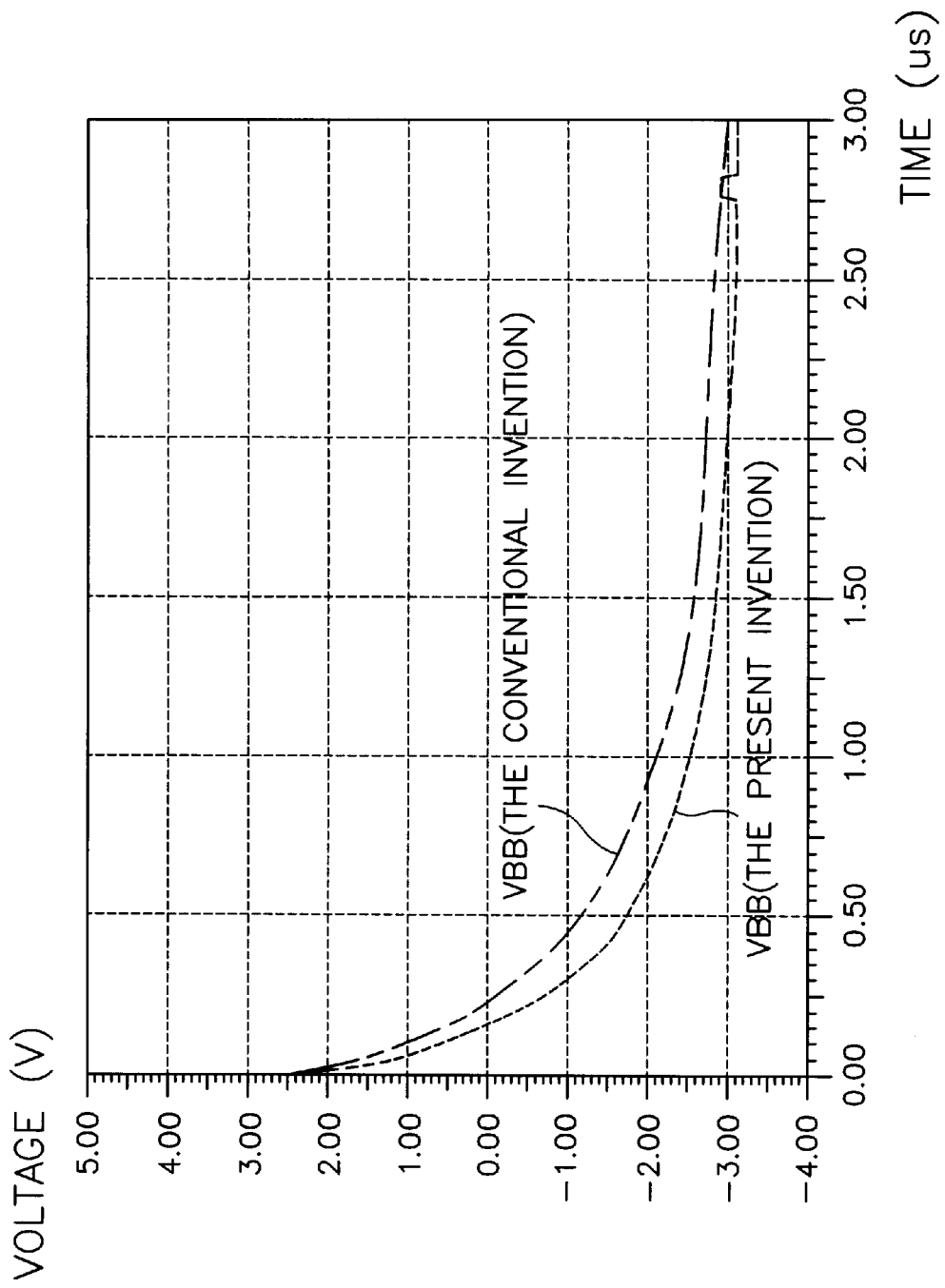
FIG. 16 depicts a simulation waveform diagram for comparing another preferred embodiment of the present invention with a conventional art.

In case of using the voltage VBB generators in the aforementioned preferred embodiments, a configuration of the preferred embodiments of the present invention is better than that of the conventional art, thereby achieving a pumping efficiency and a pumping driving ability, as shown in FIG. 16 which depicts a simulation waveform diagram for comparing another preferred embodiment of the present invention with a conventional art.

As described above, when precharging VPP or VBB pumping coupling capacitor node, the voltage generator according to the present invention lowers a threshold voltage of VPP or VBB pumping node precharge transistor simultaneously with adjusting a bulk bias of a precharge transistor. Accordingly, a current is flowed or subtracted through a pn-junction between a bulk of the precharge transistor and VPP or VBB pumping node. As a result, there is no need to increase a layout size, a pumping efficiency and a pumping driving ability are increased, thereby making a semiconductor device of a low power-consumption.

It is understood that various other modifications will be apparent to and can be readily made by those skilled in the art without departing from the scope and spirit of this invention.

Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A voltage generator having a charge pump unit which includes a pump transistor for performing a charge pumping operation by a pump control signal from a ring oscillator and a precharge transistor for performing a charge precharge operation by a precharge control signal from the ring oscillator, the voltage generator further comprising:

a controller for providing, a back-bias control signal by combining the pump control signal from the ring oscillator with the precharge control signal from the ring oscillator and controlling a threshold voltage of the precharge transistor with the back-bias control signal.

2. The voltage generator according to claim 1, wherein the controller includes:

a logic operation element for performing a logic operation between the pump control signal and the precharge control signal and providing a logic operation result signal to a back bias terminal of the precharge transistor.

3. The voltage generator according to claim 1, wherein the controller controls a bulk bias of the precharge transistor with a low level signal of a predetermined width at the same time of a transition of the pump control signal, or at the time just prior to the transition of the pump control signal.

4. The voltage generator according to claim 2, wherein the logic operation element is comprised of a NOR gate and an inverter for inverting an output signal of the NOR gate.

5. The voltage generator according to claim 2, wherein the logic operation element is comprised of a NAND gate and an inverter for inverting an output signal of the NAND gate.

6. The voltage generator according to claim 1, wherein the controller includes a buffer which buffers the pump control signal and provides a back bias terminal of the precharge transistor.

7. The voltage generator according to claim 6, wherein the buffer includes a plurality of inverters of even number.

* * * * *